(12) United States Patent
Tong et al.

(10) Patent No.: US 12,317,765 B2
(45) Date of Patent: May 27, 2025

(54) METHOD OF INDUCING CRYSTALLIZATION OF CHALCOGENIDE PHASE-CHANGE MATERIAL AND APPLICATION THEREOF

(71) Applicant: HUAZHONG UNIVERSITY OF SCIENCE AND TECHNOLOGY, Hubei (CN)

(72) Inventors: Hao Tong, Hubei (CN); Ruizhe Zhao, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 438 days.

(21) Appl. No.: 17/842,800

(22) Filed: Jun. 17, 2022

(65) Prior Publication Data

US 2022/0336743 A1    Oct. 20, 2022

Related U.S. Application Data

(63) Continuation-in-part of application No. PCT/CN2022/074185, filed on Jan. 27, 2022, and a
(Continued)

(30) Foreign Application Priority Data

Apr. 14, 2021  (CN) .......................... 202110397929.2
Sep. 30, 2021  (CN) .......................... 202111161468.5

(51) Int. Cl.
  *H10N 70/00*    (2023.01)
  *H10N 70/20*    (2023.01)

(52) U.S. Cl.
  CPC ....... *H10N 70/8833* (2023.02); *H10N 70/011* (2023.02); *H10N 70/231* (2023.02); *H10N 70/841* (2023.02)

(58) Field of Classification Search
  None
  See application file for complete search history.

(56) References Cited

U.S. PATENT DOCUMENTS

| 10,418,552 | B1 * | 9/2019 | Fantini | ............... | G11C 13/0004 |
| 10,868,245 | B1 | 12/2020 | Bai et al. | | |
| 2020/0066986 | A1 * | 2/2020 | Fantini | ................ | H10N 70/841 |

FOREIGN PATENT DOCUMENTS

| CN | 101969099 | 2/2011 |
| CN | 101976725 | 2/2011 |

(Continued)

OTHER PUBLICATIONS

"International Search Report (Form PCT/ISA/210) of PCT/CN2021/122029," mailed on Jan. 17, 2022, pp. 1-4.

(Continued)

*Primary Examiner* — Michael Lebentritt
(74) *Attorney, Agent, or Firm* — JCIPRNET

(57) ABSTRACT

The disclosure belongs to the field of microelectronics, and specifically, relates to a method of inducing crystallization of a chalcogenide phase-change material and application thereof. To be specific, a dielectric material is brought into contact with an interface of the chalcogenide phase-change material. The dielectric material is in an octahedral configuration, and the dielectric material provides a crystal nucleus growth center for the crystallization of the chalcogenide phase-change material at the interface between the two, so as to induce the phase-change material to accelerate the crystallization. The method is further applied in a phase-change memory cell. Among all the dielectric material layers in contact with the chalcogenide phase-change material layer, the dielectric material structure of at least one side of the dielectric material layer is an octahedral configuration.

12 Claims, 3 Drawing Sheets

Related U.S. Application Data continuation-in-part of application No. PCT/CN2021/122029, filed on Sep. 30, 2021.

(56) References Cited

FOREIGN PATENT DOCUMENTS

| | | |
|---|---|---|
| CN | 105525265 | 4/2016 |
| CN | 107275481 | 10/2017 |
| CN | 109728162 | 5/2019 |
| CN | 110752292 | 2/2020 |
| CN | 113241405 | 8/2021 |

OTHER PUBLICATIONS

"Written Opinion of the International Searching Authority (Form PCT/ISA/237) of PCT/CN2021/122029," mailed on Jan. 17, 2022, pp. 1-5.

Hao-Yang Li et al., "Controlled Memory and Threshold Switching Behaviors in a Heterogeneous Memristor for Neuromorphic Computing," Advanced Electronic Materials, vol. 6, Jul. 2020, pp. 1-11.

* cited by examiner

METHOD OF INDUCING CRYSTALLIZATION OF CHALCOGENIDE PHASE-CHANGE MATERIAL AND APPLICATION THEREOF

CROSS-REFERENCE TO RELATED APPLICATION

This application is a continuation-in-part of international application of PCT application serial no. PCT/CN2021/122029 filed on Sep. 30, 2021, which claims the priority benefit of China application no. 202110397929.2 filed on Apr. 14, 2021. This application is also a continuation-in-part of international application of PCT application serial no. PCT/CN2022/074185 filed on Jan. 27, 2022, which claims the priority benefit of China application no. 202111161468.5 filed on Sep. 30, 2021. The entirety of each of the above mentioned patent applications is hereby incorporated by reference herein and made a part of this specification.

BACKGROUND

Technical Field

The disclosure belongs to the field of microelectronics, and in particular, relates to a method of inducing crystallization of a chalcogenide phase-change material and application thereof.

Description of Related Art

With the advent of the information age, users' demand for high storage speed increases, and new goals are continuously proposed for the research and development of nonvolatile memory. As a result, many new memory devices have gradually become research hotspots in academia and industry. Phase-change memory devices have a relatively simple structure and have excellent storage properties such as high erasing and writing speed, low power consumption, and good radiation resistance. Phase-change memory devices are thereby regarded by the International Semiconductor Industry Association as the most likely to replace the current flash memory in the future and have become mainstream memory products and the first devices to become commercial products. The basic principle is to use phase-change materials to undergo reversible phase transitions between amorphous and polycrystalline states. By distinguishing the high resistance in the amorphous state and the low resistance in the polycrystalline state, the writing, erasing, and reading and writing operations of information are implemented.

The industry has an urgent need for the crystallization speed of the commercial development of the phase-change memory. At present, the crystallization of a phase-change material is mainly induced by some methods such as adjusting the proportion or composition of the material or doping the material. For instance, Sc doping is used to increase the number of initial four-membered rings of the phase-change material to increase the crystallization speed of the phase-change material. However, this method exhibits a series of problems such as poor thermal stability, easy oxidation, immature materials, and incompatibility with today's semiconductor processes.

SUMMARY

The disclosure provides a method of inducing crystallization of a chalcogenide phase-change material and application thereof to solve the technical problems of poor stability and incompatibility with the current semiconductor process in the method for accelerating the crystallization speed of the phase-change material provided by the related art.

The technical solutions provided by the disclosure to solve the foregoing technical problems are provided as follows. A method of inducing crystallization of a chalcogenide phase-change material is provided, and a dielectric material is brought into contact with an interface of the chalcogenide phase-change material. The dielectric material is in an octahedral configuration, and the dielectric material provides a crystal nucleus growth center for the crystallization of the chalcogenide phase-change material at the interface between the two, so as to induce the phase-change material to accelerate the crystallization.

Beneficial effects provided by the disclosure include the following. The disclosure provides a method that can improve the crystallization speed of the phase-change material without changing the original properties of the chalcogenide phase-change material. To be specific, a dielectric material is brought into contact with an interface of the chalcogenide phase-change material. The dielectric material has an octahedral configuration structure, and this structure is the same as that of the chalcogenide phase-change material. This enables the dielectric material to provide a crystal nucleus growth center for the crystallization of the chalcogenide phase-change material at the interface between the two, so that the chalcogenide phase-change material starts to grow from the crystal nucleus center. The number of four-membered rings in the process of transitioning the chalcogenide phase-change material from the amorphous state to the crystalline state is increased, and the octahedral structure formed by the four-membered rings is further increased. The transition of the chalcogenide phase-change material from the amorphous state of the tetrahedral structure to the crystalline state of the octahedron structure is accelerated, and the chalcogenide phase-change material is induced to accelerate the crystallization.

Based on the foregoing technical solutions, the following improvements are also provided by the disclosure.

Further, the melting point of the dielectric material is greater than the melting temperature of the chalcogenide phase-change material.

Beneficial effects provided by the disclosure further include the following. When the phase-change material undergoes the melting transition between the crystalline state and the amorphous state, the dielectric material may not undergo structural transformation, which does not affect its ability to induce and accelerate the crystallization process of the chalcogenide phase-change material for a long time.

Further, the dielectric material is selected from one or more of titanium oxide, yttrium oxide, scandium oxide, and aluminum oxide.

The disclosure further provides a phase-change memory cell. In the memory cell device, among all dielectric material layers in contact with a chalcogenide phase-change material layer, at least one side of the dielectric material layer is a crystalline dielectric material in an octahedral configuration. During a crystallization process of the chalcogenide phase-change material, the dielectric material provides a crystal nucleus growth center for the crystallization of the chalcogenide phase-change material at the interface between the two, so as to accelerate the crystallization process of the phase-change material.

Beneficial effects provided by the disclosure include the following. In the phase-change memory cell provided by the disclosure, a dielectric material having an octahedral structure is used for interface contact with the phase-change layer. That is, the dielectric material in contact with the phase-change layer in the existing phase-change memory cell structure is defined as having the same configuration as the phase-change material. That is, the interface exists inherently in the device without additional introduction, but the dielectric material of the octahedral configuration is selected. Therefore, no additional semiconductor process flow is added during the device preparation process, and the dielectric material may provide a crystal nucleus growth center for the crystallization of the chalcogenide phase-change material at the contact interface. Therefore, the increase of the number of four-membered rings during the transition of the chalcogenide phase-change material from the amorphous state to the crystalline state may be promoted. Herein, the chalcogenide phase-change material may be any mature chalcogenide phase-change material, which changes the limitation of controlling crystallization from material modification in the past, and makes the medium interface an effective means to control the crystallization speed of the chalcogenide phase-change material. Therefore, this phase-change memory cell design does not require optimal modification of the phase-change material. A series of other problems caused by the optimization of the phase-change material are avoided, the impact on the entire semiconductor process is minimized, and the crystallization speed of the phase-change material may be effectively accelerated.

Further, the crystalline dielectric material is selected from one or more of titanium oxide, yttrium oxide, scandium oxide, and aluminum oxide.

Further, if a lateral nanostructure is provided, all the dielectric material layers in contact with the chalcogenide phase-change material layer are two dielectric material layers that are in contact with the left and right sides of the chalcogenide phase-change material layer. Alternatively, if a vertical pinhole structure is provided, all the dielectric material layers in contact with the chalcogenide phase-change material layer are two dielectric material layers that are in contact with the upper and lower sides of the chalcogenide phase-change material layer. Alternatively, if a structure in which the dielectric material wraps the chalcogenide phase-change material is provided, all the dielectric material layers in contact with the chalcogenide phase-change material layer are four dielectric material layers that are in contact with the upper, lower, left, and right sides of the chalcogenide phase-change material layer.

Further, an electrically and thermally insulating amorphous dielectric material is laminated on the dielectric material layer to reduce leakage.

Herein, the amorphous dielectric material is independently selected from: any one or any combination of silicon oxide and silicon nitride.

Further, the phase-change memory cell also includes the following.

A substrate is included.

A lower electrode, disposed on the substrate, is included.

An electrothermal laminated dielectric material layer, including a dielectric induction layer and an electrothermal isolation layer, is included. The dielectric induction layer is a crystalline dielectric material with an octahedral configuration, and the electrothermal isolation layer is an electrically and thermally insulating amorphous dielectric material. The electrothermal laminated dielectric material layer is located on the substrate, one or more pinholes is provided in the middle of the electrothermal laminated dielectric material layer, and the bottom of the pinholes is the lower electrode.

A chalcogenide phase-change material plug is included. The chalcogenide phase-change material plug is located in the pinholes wrapped by the electrothermal laminated dielectric material layer, and the bottom of the chalcogenide phase-change material plug is formed on the top of the lower electrode.

An upper electrode is included. The upper electrode is located on the electrothermal laminated insulating dielectric material layer, and the upper electrode is disposed on the top of the chalcogenide phase-change material plug.

Further, the electrothermal laminated dielectric material layer is formed by a plurality of crystalline dielectric material layers and amorphous dielectric material layers laminated in an alternating manner.

Herein, the layer thickness of each crystalline dielectric material layer and each amorphous dielectric material layer is greater than 10 nm. The total thickness of the laminated dielectric material layer is controlled to be the same as that of the phase-change material plug. The layer thickness of each crystalline dielectric material layer and each amorphous dielectric material layer is greater than 10 nm. The thickness of greater than 10 nm can generally satisfy the accelerated crystallization properties and insulating properties of the two mentioned dielectric materials.

The disclosure further provides a novel phase-change memory with laminated dielectric material layers. Amorphous dielectric materials with high electrothermal insulation are grown with crystalline dielectric materials in octahedral configuration in an alternating manner, and a laminated dielectric material layers are obtained. The laminated dielectric material layer provided by the disclosure includes a dielectric induction layer and an electrothermal insulation layer. The dielectric induction layer provides the crystal nucleus growth center at the interface for the phase-change material through the crystalline dielectric material of octahedral configuration, and induces crystallization to a certain extent. The laminated growth of the amorphous dielectric material with high electrothermal insulation may avoid the leakage problem caused by the low resistance of the crystalline dielectric material. Therefore, better insulation is provided and leakage is well prevented without affecting the crystallization speed.

In the disclosure, the use of amorphous silicon oxide or aluminum oxide can increase the resistance of the overall dielectric material in the structure. The dielectric material originally existing in the storage unit plays a protective role to prevent thermal crosstalk between cells. In the disclosure, the dielectric material is arranged in an octahedral configuration, and the crystallization speed of the phase-change material is accelerated without additionally introducing a new material layer. However, if the electrothermal insulation properties of the dielectric material are not sufficient to meet the required high resistance, the operating voltage of the phase-change material may be split during operation to form a parallel channel. Therefore, the resistivity needs to be improved. In the disclosure, the problem of leakage is avoided by adopting the laminated dielectric material and increasing the electrothermal insulation properties.

The disclosure further provides a preparation method of the phase-change memory cell as described above. In the preparation process, a dielectric material having an octahedral configuration structure is selected as the material of at least one of all the dielectric material layers in contact with the chalcogenide phase-change material layer.

BRIEF DESCRIPTION OF THE DRAWINGS

In the accompanying drawings, the same reference numerals are used to represent identical or similar elements or structures, where.

100 is a semiconductor substrate, 101 is a dielectric material layer, 102 is an electrode layer, 103 is a chalcogenide phase-change material layer, 104 is a silicon dioxide layer, 200 is a silicon substrate, 201 is a bottom electrode/left electrode, 202 is a dielectric material with high electrothermal insulation properties, 203 is an octahedral configuration crystalline dielectric material, 204 is a phase-change material plug, and 205 is an upper electrode/right electrode.

DESCRIPTION OF THE EMBODIMENTS

In order to make the objectives, technical solutions, and advantages of the disclosure clearer and more comprehensible, the disclosure is further described in detail with reference to the drawings and embodiments. It should be understood that the specific embodiments described herein serve to explain the disclosure merely and are not used to limit the disclosure. In addition, the technical features involved in the various embodiments of the disclosure described below can be combined with each other as long as the technical features do not conflict with each other.

Embodiment One

A method of inducing crystallization of a chalcogenide phase-change material is provided, and a dielectric material is brought into contact with an interface of the chalcogenide phase-change material. The dielectric material is in an octahedral configuration, and the dielectric material provides a crystal nucleus growth center for the crystallization of the chalcogenide phase-change material at the interface between the two, so as to induce the phase-change material to accelerate the crystallization.

At present, the crystallization of a phase-change material is mainly induced by some methods such as adjusting the proportion or composition of the material or doping the material. For instance, Sc doping is used to increase the number of initial four-membered rings of the phase-change material to increase the crystallization speed of the phase-change material. However, this method exhibits a series of problems such as poor thermal stability, easy oxidation, immature materials, and incompatibility with today's semiconductor processes. Therefore, the disclosure proposes that it is very important to select any mature phase-change material that can improve the crystallization speed without changing its original properties. Further, a phase-change device is inevitably affected by the interface effect of the phase-change material and the dielectric material in contact with it, so the phase-change device may no longer maintain its own inherent properties and the performance of the device is thereby affected.

Figure 1:
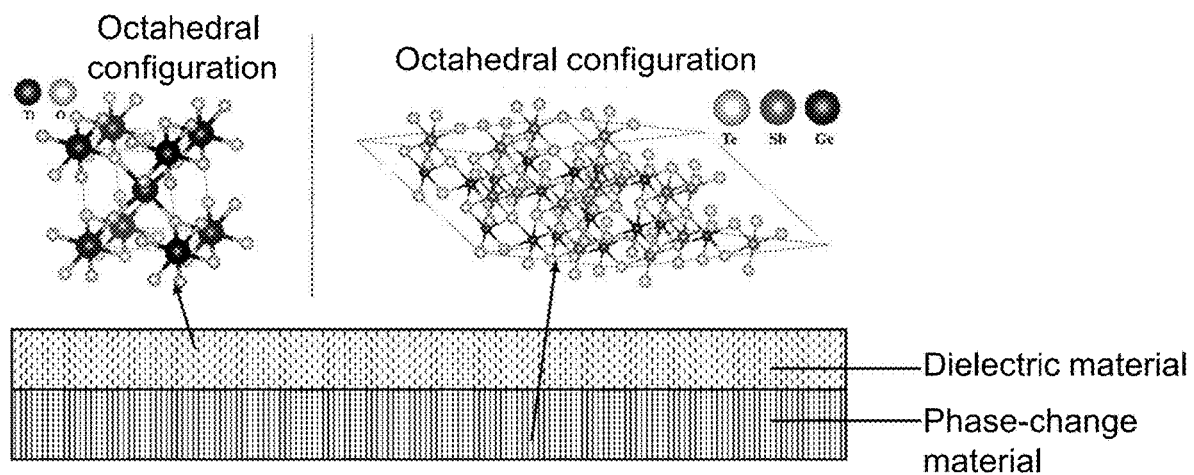
FIG. 1 is a schematic diagram of octahedral structures of a dielectric material $TiO_2$ and a phase-change material $Ge_2Sb_2Te_5$ provided by an embodiment of the disclosure.

This embodiment therefore proposes a method that can improve the crystallization speed of the phase-change material without changing the original properties of the chalcogenide phase-change material. To be specific, a dielectric material is brought into contact with an interface of the chalcogenide phase-change material. The dielectric material has an octahedral configuration structure, and this structure is the same as that of the chalcogenide phase-change material (the octahedral structures of the dielectric material $TiO_2$ and the $Ge_2Sb_2Te_5$ material as shown in FIG. 1). This enables the dielectric material to provide a crystal nucleus growth center for the crystallization of the chalcogenide phase-change material at the interface between the two, so that the chalcogenide phase-change material starts to grow from the crystal nucleus center. The number of four-membered rings in the process of transitioning the chalcogenide phase-change material from the amorphous state to the crystalline state is increased, and the octahedral structure formed by the four-membered rings is further increased. The transition of the chalcogenide phase-change material from the amorphous state of the tetrahedral structure to the crystalline state of the octahedron structure is accelerated, and the chalcogenide phase-change material is induced to accelerate the crystallization.

In order to better illustrate the effect of this embodiment, verifications are provided as follows.

Figure 2:
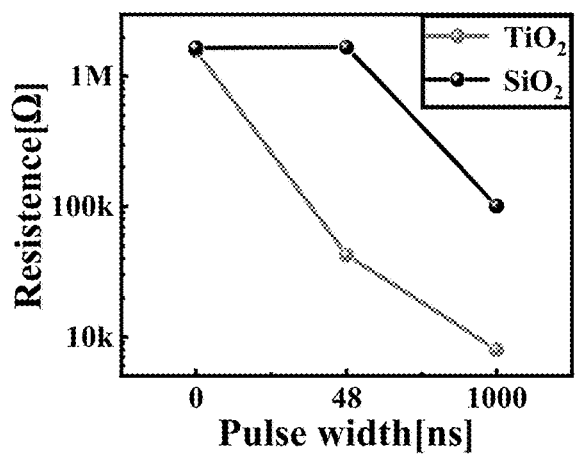
FIG. 2 is a schematic chart illustrating comparison of effects of inducing the crystallization of the phase-change material by a $TiO_2$ substrate and a $SiO_2$ substrate provided by an embodiment of the disclosure.

With reference to a schematic chart illustrating comparison of effects of inducing the crystallization of the phase-change material by a $TiO_2$ substrate and a $SiO_2$ substrate as shown in FIG. 2, this schematic chart is used to illustrate the method for accelerating the crystallization of the phase-change material induced by the $TiO_2$ substrate hereinafter. By applying the same pulse (same pulse amplitude and same pulse width), it can be seen that due to the octahedral structure of the $TiO_2$ substrate, the contact interface with the phase-change material may provide a crystal nucleus growth center to complete the crystallization. The $SiO_2$ substrate has a tetrahedral configuration, and its interface cannot provide a certain crystal nucleus growth center for the phase-change material, so the crystallization cannot be completed under the pulse condition, and a longer pulse width is required to complete the crystallization. Similarly, when the dielectric material is yttrium oxide, scandium oxide, or aluminum oxide with octahedral configuration as well, the dielectric material may provide a crystal nucleus growth center for the phase-change material at the interface and promote the completion of the crystallization process of the phase-change material.

Preferably, a substance with a melting point higher than that of the phase-change material is selected for the dielectric material, and the dielectric material may not undergo structural transformation when the phase-change material undergoes a melting transition between a crystalline state and an amorphous state.

Preferably, the dielectric material is selected from one or more of titanium oxide, yttrium oxide, scandium oxide, and aluminum oxide.

Embodiment Two

A phase-change memory cell is provided. The memory cell device, among all the dielectric material layers in contact with a chalcogenide phase-change material layer, the dielectric material structure of at least one side of the dielectric material layer is an octahedral configuration. During the crystallization process of the chalcogenide phase-change material, the dielectric material provides a crystal nucleus growth center for the crystallization of the chalcogenide phase-change material at the interface between the two, so as to accelerate the crystallization process of the phase-change material.

In the existing memory cell structure, there is a dielectric material in contact with the phase-change material, that is, an interface between the dielectric material and the phase-change material itself exists. Considering that the crystallization speed of the phase-change material and the required applied voltage are the core indicators of the phase-change functional layer, a series of important properties such as the speed, power consumption, and data retention capability of the device are determined. In this embodiment, from the perspective of improving the crystallization speed of the phase-change material, the center of crystal nucleus growth is provided through the medium interface (contact interface) between the dielectric material and the phase-change material. In this method, any mature phase-change material may be selected, such as GeSbTe series, GeSb series, GeTe series, and single-element Sb series, etc., and the use of the dielectric interface between the dielectric material and the phase-change material may be an effective means to control device performance.

Therefore, in the phase-change memory cell provided in this embodiment, a dielectric material having an octahedral structure is used for interface contact with the phase-change layer. That is, the dielectric material in contact with the phase-change layer in the existing phase-change memory cell structure is defined as having the same configuration as the phase-change material. That is, the interface exists inherently in the device without additional introduction, but the dielectric material of the octahedral configuration is selected. Therefore, no additional semiconductor process flow is added during the device preparation process, and the dielectric material may provide a crystal nucleus growth center for the crystallization of the chalcogenide phase-change material at the contact interface. Therefore, the increase of the number of four-membered rings during the transition of the chalcogenide phase-change material from the amorphous state to the crystalline state may be promoted. Herein, the chalcogenide phase-change material may be any mature chalcogenide phase-change material, which changes the limitation of controlling crystallization from material modification in the past, and makes the medium interface an effective means to control the crystallization speed of the chalcogenide phase-change material. Therefore, this phase-change memory cell design does not require optimal modification of the phase-change material. A series of other problems caused by the optimization of the phase-change material are avoided, the impact on the entire semiconductor process is minimized, and the crystallization speed of the phase-change material may be effectively accelerated.

It should be noted that the abovementioned dielectric material has high electrothermal insulation properties, a large forbidden band width, and the melting point of the dielectric material is greater than the melting temperature of the chalcogenide phase-change material. A substance with better electrothermal insulation properties and a larger forbidden band width is selected for the dielectric material, so the properties of the insulating medium may be satisfied, and the performance of the device may not be affected. In addition, a substance with a melting point greater than that of the phase-change material is selected for the dielectric material, and the dielectric material may not undergo structural transformation when the phase-change material undergoes a melting transition between a crystalline state and an amorphous state. Further, the dielectric material itself is not a functional material. Therefore, no structural transformation will occur, nor will the failure problem of the chalcogenide phase-change material due to the switching of high and low resistance values after structural optimization occur in this process, and the impact is minimized.

Preferably, the dielectric material is selected from one or more of titanium oxide, yttrium oxide, scandium oxide, and aluminum oxide.

Preferably, if a lateral nanostructure is provided, all the dielectric material layers in contact with the chalcogenide phase-change material layer are two dielectric material layers that are in contact with the left and right sides of the chalcogenide phase-change material layer. Alternatively, if a vertical pinhole structure is provided, all the dielectric material layers in contact with the chalcogenide phase-change material layer are two dielectric material layers that are in contact with the upper and lower sides of the chalcogenide phase-change material layer. Alternatively, if a structure in which the dielectric material wraps the chalcogenide phase-change material is provided, all the dielectric material layers in contact with the chalcogenide phase-change material layer are four dielectric material layers that are in contact with the upper, lower, left, and right sides of the chalcogenide phase-change material layer.

Based on the foregoing, when the phase-change material has multiple contact interfaces, the contact interfaces include contact interfaces between the phase-change material layer and the upper and lower or left and right dielectric material layers. Further, the contact interfaces are inherent in the device itself without additional introduction, and the interfaces may induce accelerated crystallization of the phase-change material.

Embodiment Three

A preparation method of the phase-change memory cell as described in embodiment two is provided. In the preparation process, a dielectric material having an octahedral configuration structure is selected as the material of at least one of all the dielectric material layers in contact with the chalcogenide phase-change material layer.

Specific examples are provided as follows.

Figure 3:
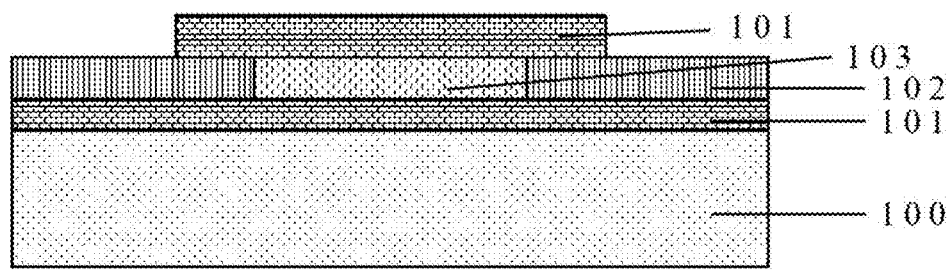
FIG. 3 is a schematic structural diagram of a lateral phase-change memory cell provided by an embodiment of the disclosure.

FIG. 3 is a structure of a phase-change memory cell with a lateral nanostructure, and the fabrication steps are provided as follows.

In step 1, photolithography is performed on a silicon substrate (i.e., semiconductor substrate 100) having a crystal orientation of <100> and having a lower dielectric material layer 101 on the surface. The material of the lower dielectric material layer 101 is a titanium oxide material. An electrode layer 102 is then deposited on the photoetched substrate by a magnetron sputtering coating method, and after peeling off, two symmetrical left and right electrodes are obtained. The thickness of the left and right electrodes is 50 nm, and the materials of the left and right electrodes are titanium and platinum or chromium and gold.

In step 2, electron beam exposure is performed on the substrate grown with the electrodes, and a lateral nanobridge structure with a width of 50 nm to 200 nm and a length of 500 nm to 2 μm is photolithographically produced. A chalcogenide phase-change material layer 103 is subsequently deposited on the exposed substrate by using the magnetron sputtering coating method. A degumming operation is then performed to obtain the lateral nanobridge structure of the phase-change material. The material of the chalcogenide phase-change material layer 103 is $Ge_2Sb_2Te_5$, and the thickness of the chalcogenide phase-change material layer 103 is 50 nm to 100 nm.

In step 3, photolithography is performed on the substrate. An upper dielectric material layer 101 is then deposited on the photoetched substrate by the magnetron sputtering coating method, and after peeling off, the upper dielectric material layer 101 covering the surface of the chalcogenide phase-change material layer 103 is obtained. The thickness of the upper dielectric material layer 101 is 50 nm to 100 nm, and the material of the upper dielectric material layer 101 is a titanium oxide material.

Figure 4:
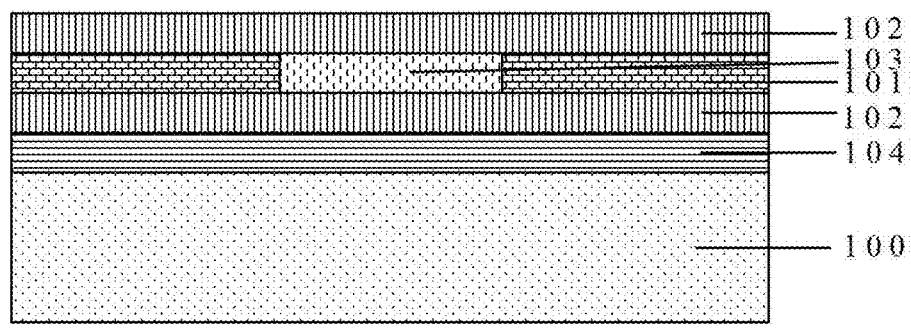
FIG. 4 is a schematic structural diagram of a vertical pinhole phase-change memory cell provided by an embodiment of the disclosure.

Similarly, FIG. 4 is a structure of a vertical pinhole phase-change memory cell, the fabrication steps are provided as follows.

In step 1, an electrode layer 102 is deposited on a silicon substrate (semiconductor substrate 100) with a crystal orientation of <100> and a $SiO_2$ layer (i.e., silicon dioxide layer 104) on the surface by magnetron sputtering. The electrode thickness is 100 nm, and the electrode material is Ti/Pt or TiW.

In step 2, a dielectric material layer 108 is deposited on the substrate with electrodes by magnetron sputtering. The dielectric material layer 101 is titanium oxide, and the thickness of the dielectric material layer is 100 nm.

In step 3, electron beam exposure is performed on the substrate grown with the dielectric material. A via structure with a radius of 125 nm to 500 nm is photolithographically produced, and a pinhole with a depth of 100 nm is subsequently obtained by etching.

In step 4, the chalcogenide phase-change material layer 103 and the electrode material layer 102 are sequentially deposited on the substrate by the magnetron sputtering coating method. The chalcogenide phase-change material layer is $Ge_2Sb_2Te_5$, the thickness of the chalcogenide phase-change material layer 103 is 100 nm, the material of the electrode layer 102 is Pt, and the thickness of the electrode layer 102 is 100 nm. The preparation may be completed by peeling off.

Figure 5:
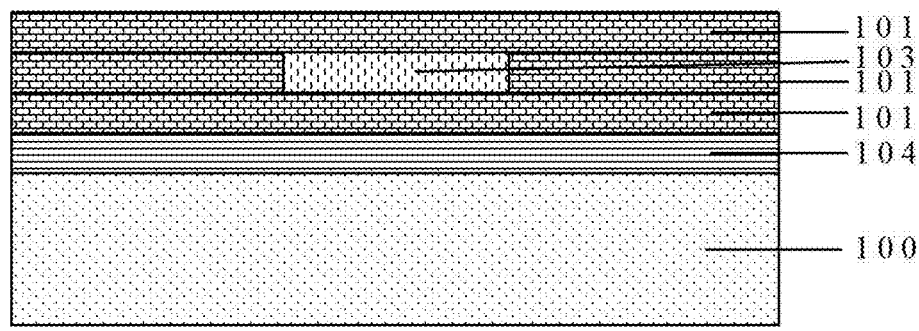
FIG. 5 is a schematic structural diagram of a phase-change memory cell wrapped with a dielectric material provided by an embodiment of the disclosure.

Similarly, FIG. 5 is a structure in which a phase-change memory cell is wrapped with a dielectric material, the fabrication steps are provided as follows.

In step 1, photolithography is performed on a silicon substrate having a crystal orientation of <100> and having a lower dielectric material layer 101 on the surface. The material of the dielectric material layer 101 is a titanium oxide material. One dielectric material layer 101 is then deposited on the photoetched substrate by a magnetron sputtering coating method, and after peeling off, two symmetrical left and right electrodes are obtained. The thickness of the dielectric material layer 101 is 100 nm, and the material of the dielectric material layer is a titanium oxide material.

In step 2, electron beam exposure is performed on the substrate grown with the dielectric material, and a lateral nanobridge structure with a width of 50 nm to 200 nm and a length of 500 nm to 2 μm is photolithographically produced. One chalcogenide phase-change material layer 103 is subsequently deposited on the exposed substrate by using the magnetron sputtering coating method. A degumming operation is then performed to obtain the lateral nanobridge structure of the phase-change material. The chalcogenide phase-change material layer 103 is $Ge_2Sb_2Te_5$, and the thickness of the chalcogenide phase-change material layer 103 is 50 nm to 100 nm.

In step 3, photolithography is performed on the substrate. One upper dielectric material layer 101 is then deposited on the photoetched substrate by the magnetron sputtering coating method, and after peeling off, the upper dielectric material layer 101 covering the surface of the chalcogenide phase-change material layer 103 is obtained. The thickness of the upper dielectric material layer 101 is 50 nm to 100 nm, and the material of the upper dielectric material layer 101 is a titanium oxide material.

In the above structure, the dielectric material in contact with the chalcogenide phase-change material includes upper and lower or left and right electrothermal insulating materials and is wrapped around the phase-change material. The upper and lower or left and right dielectric materials have the same octahedral configuration as the phase-change material, and the contact interface may provide a crystal nucleus growth center for the phase-change material. Therefore, the number of four-membered rings increases during the transition of the phase-change material from the amorphous state to the crystalline state, and the phase-change material is induced to accelerate crystallization.

In view of the foregoing, the disclosure relates to a method of inducing accelerated crystallization of a phase-change material using a dielectric material. In the method, the interface between the dielectric material layer with an octahedral configuration and the phase-change material layer provides a crystal nucleus growth center for the phase-change material, and in this way, the number of four-membered rings increases in the transition process of the phase-change material from the amorphous state to the crystalline state, so that the phase-change material may be induced to accelerate the crystallization. The phase-change material may be selected from any mature material in the disclosure. A series of existing problems such as material immaturity and easy oxidation brought about by the accelerated crystallization process through material modification, failure caused by high and low resistance switching caused by phase-change material modification, and incompatibility with semiconductor technology are effectively overcome. Further, the interface in contact with the phase-change material is inherent in the device itself, rather than additionally introduced. The dielectric material may not undergo structural changes when the phase-change material is switched between high and low resistance values, so it has high commercial value for the industrial development of the phase-change memory.

Embodiment Four

A phase-change memory cell is provided. At least one side of all the dielectric material layers in contact with a chalcogenide phase-change material layer has a dielectric material layer. On the one hand, the dielectric material is a crystalline dielectric material with an octahedral configuration. During the crystallization process of the chalcogenide phase-change material, the dielectric material provides a crystal nucleus growth center for the crystallization of the chalcogenide phase-change material at the interface between the two, so as to accelerate the crystallization process of the phase-change material. On the other hand, an electrically and thermally insulating amorphous dielectric material is laminated thereon to reduce leakage.

Figure 6:
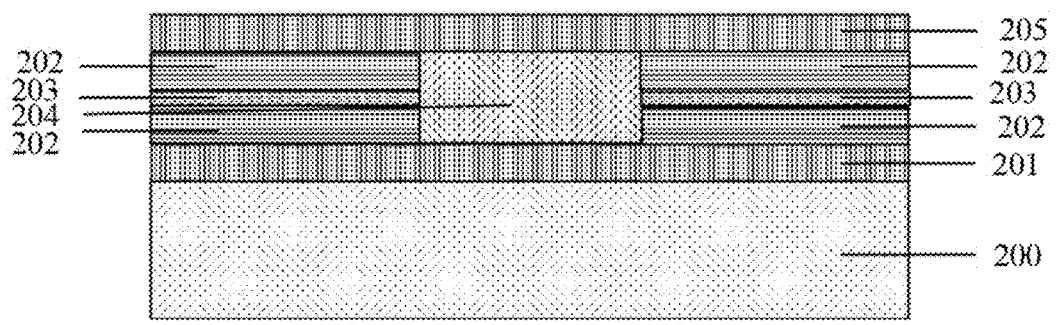
FIG. 6 is a phase-change memory cell with a vertical pinhole nanostructure provided by an embodiment of the disclosure.
Figure 7:
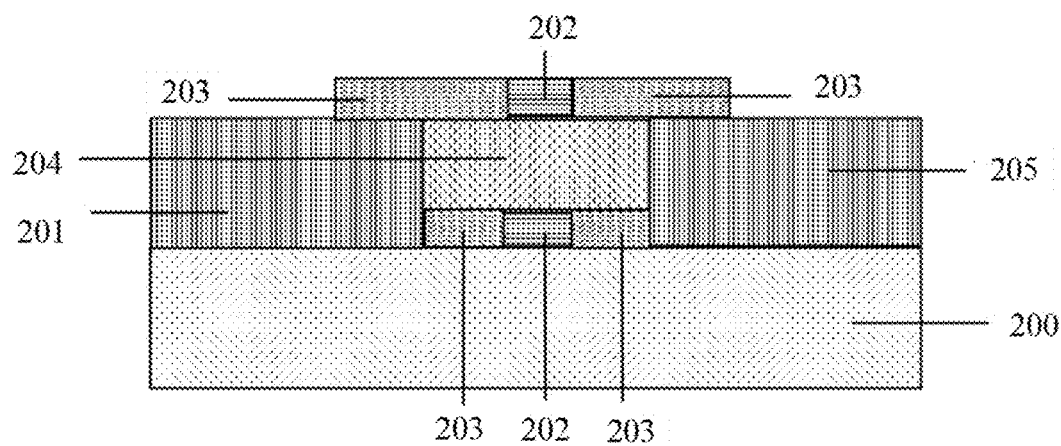
FIG. 7 is a phase-change memory cell with a lateral nanostructure provided by an embodiment of the disclosure.

Note that if a lateral nanostructure is provided for the phase-change memory cell, all the dielectric material layers in contact with the chalcogenide phase-change material layer are two dielectric material layers that are in contact with the left and right sides of the chalcogenide phase-change material layer. Alternatively, if a vertical pinhole structure is provided for the phase-change memory cell, all the dielectric material layers in contact with the chalcogenide phase-change material layer are two dielectric material layers that are in contact with the upper and lower sides of the chalcogenide phase-change material layer. Alternatively, if a structure in which the dielectric material wraps the chalcogenide phase-change material is provided for the phase-change memory cell, all the dielectric material layers in contact with the chalcogenide phase-change material layer are four dielectric material layers that are in contact with the upper, lower, left, and right sides of the chalcogenide phase-change material layer. FIG. 6 illustrates a vertical pinhole nanostructure, and FIG. 7 illustrates a lateral nanostructure.

A novel phase-change memory with laminated dielectric material layers is provided in this embodiment. Amorphous dielectric materials with high electrothermal insulation are grown with crystalline dielectric materials in octahedral configuration in an alternating manner, and a laminated dielectric material layers are obtained. The laminated dielectric material layer provided by the disclosure includes a dielectric induction layer and an electrothermal insulation layer. The dielectric induction layer provides the crystal nucleus growth center at the interface for the phase-change material through the crystalline dielectric material of octahedral configuration, and induces crystallization to a certain extent. The laminated growth of the amorphous dielectric material with high electrothermal insulation may avoid the leakage problem caused by the low resistance of the crystalline dielectric material. Therefore, better insulation is provided and leakage is well prevented without affecting the crystallization speed. Regarding the existing laminated dielectric materials, silicon oxide and silicon nitride are mainly used to make the heat of the phase-change material more concentrated, thereby reducing power consumption.

Preferably, a novel phase-change memory structure with laminated dielectric material layers is provided in the disclosure, and the structure includes the following.

A substrate, specifically a semiconductor substrate, is included.

A lower electrode, disposed on the substrate, is included. The lower electrode is deposited on the substrate. The electrode material may be a metal or non-metal with good electrical conductivity, such as titanium, platinum, titanium nitride, tantalum nitride, titanium-tungsten alloy, tungsten, and the like. The thickness of the lower electrode is 100 nm to 500 nm.

An electrothermal laminated dielectric material layer, including a dielectric induction layer and an electrothermal isolation layer, is included. The dielectric induction layer is an octahedral configuration crystalline dielectric material and provides a crystal nucleus growth center for the phase-change material at the contact interface with the phase-change material, thereby inducing crystallization. The electrothermal isolation layer is a dielectric material with high resistivity and may provide good insulation and reduce leakage. The electrothermal laminated dielectric material layer is located on the substrate, one or more pinholes is provided in the middle of the electrothermal laminated dielectric material layer, and the bottom of the pinholes is the lower electrode.

A chalcogenide phase-change material plug is included. The chalcogenide phase-change material is located in the pinholes wrapped by the electrothermal laminated dielectric material layer, and the bottom of the chalcogenide phase-change material plug is formed on the top of the lower electrode.

An upper electrode is included. The upper electrode is located on the electrothermal laminated insulating dielectric material layer, and the upper electrode is disposed on the top of the chalcogenide phase-change material plug.

Herein, the planar dimension of the electrothermal laminated dielectric material layer is less than the substrate, so that the lower electrode is partially exposed.

In order to better illustrate the disclosure, examples are provided as follows.

As shown in FIG. 6, a novel phase-change memory with laminated dielectric material layers is provided in the disclosure, and the devices includes the following.

A substrate 200, specifically a semiconductor substrate, is included.

A lower electrode 201 is included. The lower electrode is deposited on the substrate 200. The electrode material may be a metal or non-metal with good electrical conductivity, such as titanium, platinum, titanium nitride, tantalum nitride, titanium-tungsten alloy, tungsten, and the like. The thickness of the lower electrode is 100 nm to 500 nm.

An electrothermal laminated dielectric material layer, formed by growing a high electrothermal insulating amorphous dielectric material 202 and an octahedral configuration crystalline dielectric material 203 in an alternating manner, is included. The electrothermal laminated dielectric material layer is prepared on the substrate 200 of the lower electrode 201. The high electrothermal insulating amorphous dielectric material 202 may be any one or any combination of silicon oxide, silicon nitride, and their compounds. The thickness of the high electrothermal insulating amorphous dielectric material is 50 nm to 60 nm. The octahedral configuration crystalline dielectric material 203 may be any one or any combination of titanium oxide, yttrium oxide, scandium oxide, aluminum oxide, and compounds thereof. The thickness of the octahedral configuration crystalline dielectric material 203 is 10 nm to 20 nm. The electrothermal laminated dielectric material layer is slightly less than the substrate 200, so that a part of the lower electrode 201 may be exposed. One or more pinholes is provided in the middle of the electrothermal laminated dielectric material layer, and the bottom of the pinholes is the lower electrode 201.

A chalcogenide phase-change material plug 204 is includes. The chalcogenide phase-change material plug 204 is located in the pinholes wrapped by the electrothermal laminated dielectric material layer 202 and 203, and the bottom of the chalcogenide phase-change material plug 204 is formed on the top of the lower electrode 201. The thickness of the chalcogenide phase-change material plug 204 is 100 nm to 200 nm. The chalcogenide phase-change material plug 204 may be any one or any combination of GeSbTe, GeTe, SbTe, BiTe, elemental Sb, and compounds thereof, and may be a mixture formed by doping at least one element of S, N, O, Cu, Si, Cr, Y, Sc, Ti, and Ni.

An upper electrode 205 is included. The upper electrode 205 is located on the top of the chalcogenide phase-change material plug 204. The electrode material may be a metal or non-metal with good electrical conductivity, such as titanium, platinum, titanium nitride, tantalum nitride, titanium-tungsten alloy, tungsten, and the like. The thickness of the upper electrode 205 is 100 nm to 500 nm.

The abovementioned preparation method of the phase-change memory with the laminated dielectric material layer includes the following steps.

1) A semiconductor substrate is provided.

2) The upper surface of the substrate is treated as the base surface, and a layer of lower electrodes is deposited on the substrate by magnetron sputtering or electron beam evaporation.

3) An electrothermal laminated dielectric material is prepared, and the laminated dielectric material is obtained by growing an amorphous high electrothermal insulating dielectric material and a crystalline octahedral configuration dielectric material in an alternating manner.

4) Photolithography is performed on the electrothermal laminated dielectric material, followed by etching to partially expose the bottom electrode and form a pinhole.

5) The pinhole is filled with a chalcogenide phase-change material plug, and then the filling is made even by a polishing process. A layer of upper electrode is deposited and then peeled off to complete the preparation of the phase-change memory layered with the dielectric material layer.

The number of alternating layers of the laminated dielectric material layers of the disclosure is not limited. In addition, the total thickness of the laminated dielectric material layer is controlled to be the same as that of the phase-change material plug. The layer thickness of each crystalline dielectric material layer and each amorphous dielectric material layer is greater than 10 nm. The thickness of greater than 10 nm can generally satisfy the accelerated crystallization properties and insulating properties of the two mentioned dielectric materials, and is obtained according to experience.

A person having ordinary skill in the art should be able to easily understand that the above description is only preferred embodiments of the disclosure and is not intended to limit the disclosure. Any modifications, equivalent replacements, and modifications made without departing from the spirit and principles of the disclosure should fall within the protection scope of the disclosure.

What is claimed is:

1. A method of inducing crystallization of a chalcogenide phase-change material, comprising bringing a dielectric material into contact with an interface of the chalcogenide phase-change material, wherein the dielectric material is in an octahedral configuration, and the dielectric material provides a crystal nucleus growth center for the crystallization of the chalcogenide phase-change material at the interface between the dielectric material and the chalcogenide phase-change material, so as to induce the chalcogenide phase-change material to accelerate the crystallization.

2. The method of inducing crystallization of the chalcogenide phase-change material according to claim 1, wherein the melting point of the dielectric material is greater than the melting temperature of the chalcogenide phase-change material.

3. The method of inducing crystallization of the chalcogenide phase-change material according to claim 2, wherein the dielectric material is selected from one or more of titanium oxide, yttrium oxide, scandium oxide, and aluminum oxide.

4. A phase-change memory cell, wherein in the phase-change memory cell device, among all dielectric material layers in contact with a chalcogenide phase-change material layer, at least one side of the dielectric material layer is a crystalline dielectric material in an octahedral configuration, and during a crystallization process of the chalcogenide phase-change material, the dielectric material provides a crystal nucleus growth center for the crystallization of the chalcogenide phase-change material at the interface between the dielectric material and the chalcogenide phase-change material, so as to accelerate the crystallization process of the chalcogenide phase-change material.

5. The phase-change memory cell according to claim 4, wherein the crystalline dielectric material is selected from one or more of titanium oxide, yttrium oxide, scandium oxide, and aluminum oxide.

6. The phase-change memory cell according to claim 4, wherein the phase-change memory cell structure is a lateral nanostructure, all the dielectric material layers in contact with the chalcogenide phase-change material layer are two dielectric material layers that are in contact with the left and right sides of the chalcogenide phase-change material layer, or the phase-change memory cell structure is a vertical pinhole structure, all the dielectric material layers in contact with the chalcogenide phase-change material layer are two dielectric material layers that are in contact with the upper and lower sides of the chalcogenide phase-change material layer, or the phase-change memory cell structure is the dielectric material wraps the chalcogenide phase-change material, all the dielectric material layers in contact with the chalcogenide phase-change material layer are four dielectric material layers that are in contact with the upper, lower, left, and right sides of the chalcogenide phase-change material layer.

7. The phase-change memory cell according to claim 4, wherein an electrically and thermally insulating amorphous dielectric material is laminated on the dielectric material layer to reduce leakage.

8. The phase-change memory cell according to claim 7, wherein the amorphous dielectric material is independently selected from: any one or any combination of silicon oxide and silicon nitride.

9. The phase-change memory cell according to claim 7, comprising:
a substrate;
a lower electrode, disposed on the substrate;
an electrothermal laminated dielectric material layer, comprising a dielectric induction layer and an electrothermal isolation layer; wherein the dielectric induction layer is a crystalline dielectric material with an octahedral configuration, the electrothermal isolation layer is an electrically and thermally insulating amorphous dielectric material, the electrothermal laminated dielectric material layer is located on the substrate, there is one or more pinholes in the middle of the electrothermal laminated dielectric material layer, and the bottom of the pinholes is the lower electrode;
a chalcogenide phase-change material plug, wherein the chalcogenide phase-change material plug is located in the pinholes wrapped by the electrothermal laminated dielectric material layer, and the bottom of the chalcogenide phase-change material plug is formed on the top of the lower electrode;

an upper electrode, wherein the upper electrode is located on the electrothermal laminated insulating dielectric material layer, and the upper electrode is disposed on the top of the chalcogenide phase-change material plug.

10. The phase-change memory cell according to claim 9, wherein the electrothermal laminated dielectric material layer is configured by a plurality of crystalline dielectric material layers and amorphous dielectric material layers laminated in an alternating manner.

11. The phase-change memory cell according to claim 4, wherein a layer thickness of each crystalline dielectric material layer and each amorphous dielectric material layer is greater than 10 nm.

12. A preparation method of the phase-change memory cell according to claim 4, wherein in the preparation process, a dielectric material having an octahedral configuration structure is selected as the material of at least one of all the dielectric material layers in contact with the chalcogenide phase-change material layer.

* * * * *